(12) United States Patent
Kim et al.

(10) Patent No.: US 11,220,758 B2
(45) Date of Patent: Jan. 11, 2022

(54) SYSTEMS AND METHODS FOR THERMAL HYDRO-SYNTHESIS OF SEMICONDUCTOR MATERIALS BY HOLDING A SUBSTRATE WAFER WITHIN A CHAMBER IN A VERTICAL DIRECTION

(71) Applicant: SEOUL VIOSYS CO., LTD., Ansan-si (KR)

(72) Inventors: Yi Jung Kim, Ansan-si (KR); Seom Geun Lee, Ansan-si (KR); Young Deuk Park, Ansan-si (KR); Ki Suk Kim, Ansan-si (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 101 days.

(21) Appl. No.: 15/623,345

(22) Filed: Jun. 14, 2017

(65) Prior Publication Data
US 2017/0365758 A1    Dec. 21, 2017

Related U.S. Application Data

(60) Provisional application No. 62/350,599, filed on Jun. 15, 2016.

(51) Int. Cl.
| | | |
|---|---|---|
| *H01L 21/02* | (2006.01) | |
| *C30B 7/10* | (2006.01) | |
| *C30B 29/16* | (2006.01) | |
| *H01L 33/42* | (2010.01) | |

(52) U.S. Cl.
CPC ............. *C30B 7/10* (2013.01); *C30B 29/16* (2013.01); *H01L 21/02458* (2013.01); *H01L 21/02554* (2013.01); *H01L 21/02628* (2013.01); *H01L 33/42* (2013.01); *H01L 2933/0016* (2013.01)

(58) Field of Classification Search
CPC ......... H01L 21/67028; H01L 21/67086; H01L 21/02628; H01L 21/67017; C30B 19/06; C30B 19/062
See application file for complete search history.

(56) References Cited

U.S. PATENT DOCUMENTS

| | | | | |
|---|---|---|---|---|
| 2,484,829 A | * | 10/1949 | Holden | C30B 7/10 117/206 |
| 3,715,245 A | * | 2/1973 | Barnett | C30B 19/062 117/56 |
| 5,503,171 A | * | 4/1996 | Yokomizo | H01L 21/67057 134/182 |
| 5,672,212 A | * | 9/1997 | Manos | B08B 3/12 134/1.3 |
| 6,109,278 A | * | 8/2000 | Shindo | B08B 3/00 134/56 R |
| 6,817,369 B1 | * | 11/2004 | Riedel | H01L 21/31133 134/105 |
| 2001/0013555 A1 | * | 8/2001 | Egashira | H01L 21/67051 239/13 |
| 2002/0029789 A1 | * | 3/2002 | Egashira | B08B 3/02 134/2 |

(Continued)

*Primary Examiner* — Matthew J Song
(74) *Attorney, Agent, or Firm* — Perkins Coie LLP

(57) ABSTRACT

Devices, systems and methods for fabricating semiconductor material devices by placing a batch of wafers in a chemical solution within a growth chamber. The wafers are held in a vertical direction and are actuated to move within the chemical solution while growing a layer over exposed surfaces of the wafers.

3 Claims, 8 Drawing Sheets

(56) References Cited

U.S. PATENT DOCUMENTS

| | | | | |
|---|---|---|---|---|
| 2002/0061632 A1* | 5/2002 | Ukiyo | .................. | C30B 19/062 |
| | | | | 438/479 |
| 2005/0097771 A1* | 5/2005 | Yi | ..................... | H01L 21/67028 |
| | | | | 34/444 |
| 2006/0060232 A1* | 3/2006 | Tsurusaki | .......... | H01L 21/67086 |
| | | | | 134/56 R |
| 2007/0175062 A1* | 8/2007 | Toshima | ........... | H01L 21/67028 |
| | | | | 34/410 |
| 2009/0090396 A1* | 4/2009 | Lee | .................. | H01L 21/67057 |
| | | | | 134/34 |
| 2010/0263586 A1* | 10/2010 | Richardson | ............. | C30B 7/005 |
| | | | | 117/64 |
| 2011/0126860 A1* | 6/2011 | Hyakutake | ........ | H01L 21/67057 |
| | | | | 134/19 |
| 2012/0006726 A1* | 1/2012 | Kusuhara | ............. | B28D 5/0082 |
| | | | | 209/3.1 |
| 2013/0048034 A1* | 2/2013 | Maegawa | ......... | H01L 21/67057 |
| | | | | 134/104.2 |
| 2013/0316485 A1* | 11/2013 | Furutani | ........... | H01L 21/67086 |
| | | | | 438/57 |
| 2015/0197861 A1* | 7/2015 | Tice | .................. | H01L 21/67086 |
| | | | | 216/91 |
| 2016/0348272 A1* | 12/2016 | Hayashi | .................... | C30B 9/10 |
| 2017/0297921 A1* | 10/2017 | Richardson | ............. | C01G 9/02 |

\* cited by examiner

405 ⟶

Side view of the holder for holding multiple wafers

SYSTEMS AND METHODS FOR THERMAL HYDRO-SYNTHESIS OF SEMICONDUCTOR MATERIALS BY HOLDING A SUBSTRATE WAFER WITHIN A CHAMBER IN A VERTICAL DIRECTION

CROSS-REFERENCE TO RELATED APPLICATIONS

This application claims the benefits and priority of U.S. Provisional Patent Application No. 62/350,599, filed on Jun. 15, 2016, which is hereby incorporated by reference for all purposes as if fully set forth herein.

TECHNICAL FIELD

This patent document relates to systems, devices, and processes that use semiconductor technologies in optoelectronic devices.

BACKGROUND

A light-emitting diode (LED) is a light source that efficiently converts electrical energy into light based on the photo-electronic properties of certain semiconductor materials and device structures. An LED includes semiconducting materials doped with impurities to create a p-n junction with an anode electrically coupled to the p-side and a cathode coupled to the n-side to allow charge-carriers (e.g., electrons and holes) to flow into the p-n junction. In operation, when an electron combines with a hole in the p-n junction, the electron falls into a lower energy level and can release energy in the form of a photon, i.e., emitting light. This effect is referred to as electroluminescence. The wavelength of the light emitted, and thus the color of the emitted light, depends on the band gap energy of the materials forming the p-n junction. For example, bright blue LEDs are based on the wide band gap semiconductors including GaN (gallium nitride) and InGaN (indium gallium nitride).

SUMMARY

Thermal hydro-synthesis (THS) devices, systems, and methods are disclosed for forming layers of semiconductor materials to produce LEDs and optoelectronic devices, including THS devices, systems and methods for producing a ZnO layer on GaN layer (e.g., p-type GaN layer). Different THS growth chambers are disclosed to hold a substrate wafer in a vertical direction along a gravitational field, In one aspect, a device for fabricating a semiconductor material device includes a housing structured to include an interior chamber to contain a fluid, the housing including a first access opening to the interior chamber to allow a liquid solution to enter, a second access opening to the interior chamber to allow the liquid solution to exit, and a third access opening to the interior chamber to allow a gas to exit or enter; a heating unit to apply heat into the interior chamber; a holder disposed within the interior chamber and structured to include a receiving surface to receive a sample or substrate upon which to fabricate semiconductor device layers, where the holder is oriented in the interior chamber such that the receiving surface is along a vertical direction; and a motor coupled to the holder and operable to drive rotational movement of the holder within the interior chamber to cause the holder to spin about its central axis, in which the device is operable to facilitate deposition and growth of a semiconductor layer on the substrate during spinning of the holder immersed in the solution under applied heat within the interior chamber to produce a semiconductor material device.

In another aspect, a method for fabricating a light emitting diode (LED) device including a ZnO structure includes holding a substrate wafer within a chamber so that a surface of the substrate wafer is along a vertical direction along a gravitational field, in which the substrate wafer is previously processed to include light-emitting semiconductor layers operable to emit light under electrical excitation; spinning the substrate wafer to spin about a horizontal axis; and while maintaining the substrate wafer to spin about the horizontal axis, performing a thermal hydro synthesis process to grow a single crystal ZnO structure over the light-emitting semiconductor layers to achieve a high quality in the grown single crystal ZnO structure.

In another aspect, a device is provided for fabricating a semiconductor material device and includes an exterior housing structured to form a closure and a top opening door to open or close the closure; a chemical circulation tank, located inside the exterior housing, structured to hold a fluid and to include a top opening door to open or close the chemical circulation tank; a growth chamber, located inside the chemical circulation tank, structured to hold a fluid and to include a top opening door to open or close the growth chamber, the growth chamber including an overflow path to allow a liquid inside the growth chamber to flow into the chemical circulation tank; a first chemical supply line coupled to the growth chamber to supply a first chemical liquid into the growth chamber; a second chemical supply line, separated from the first chemical supply line, coupled to the growth chamber to supply a second chemical liquid into the growth chamber; one or more heating units coupled to the growth chamber, the first chemical supply line or the second chemical supply line, to apply heat provide a controlled heated condition of a chemical liquid inside the growth chamber; an actuator arm located inside the exterior housing to include an extension arm to reach into the growth chamber via the chemical circulation tank, wherein the extension arm is structured to removably engage to a removable wafer holding cassette that includes vertical wafer holding slots for holding wafers inside the growth chamber for growing material layers on the wafers and is removable from the extension arm through the top opening of the growth chamber, the top opening of the chemical circulation tank and the top opening of the exterior housing; and a motor engaged to the actuator arm and operable to cause motion of the actuator arm so as to move a position of the removable wafer holding cassette inside the growth chamber during growth of material layers on the wafers.

In another aspect, a method for fabricating a semiconductor material device is provided to include placing a batch of wafers into a growth chamber along a vertical direction; operating a first chemical supply line coupled to the growth chamber to supply a first chemical liquid into the growth chamber; operating a second chemical supply line, separated from the first chemical supply line, coupled to the growth chamber to supply a second chemical liquid into the growth chamber to mix with the first chemical liquid to form a chemical solution for growing a layer over the wafers; pre-heating the first chemical liquid in the first chemical supply line and the second chemical liquid in the second chemical supply line to place the chemical solution in the growth chamber in a controlled heated condition for growing the layer over the wafers; and causing motion of the wafers in the chemical solution during growth of the layer on the wafers.

In yet another aspect, a method for fabricating a semiconductor material device is provided to include placing a batch of wafers into a chemical solution inside a growth chamber to grow a layer over exposed surfaces of the wafers at an elevated temperature. The growth of the layer on the wafers involves consumption or reduction of one or more chemical components in the chemical solution supplied from the first chemical supply line. This method further includes operating a first chemical supply line coupled to the growth chamber to supply the chemical solution into the growth chamber; and operating a second chemical supply line, separated from the first chemical supply line and coupled to the growth chamber, to supply to add the one or more chemical components as part of a chemical liquid into the growth chamber to maintain a desired concentration of the one or more chemical components in the chemical solution for growing the layer over the wafers.

The above and other aspects and their implementations are described in greater detail in the drawings, the description and the claims.

DETAILED DESCRIPTION

Figure 1:
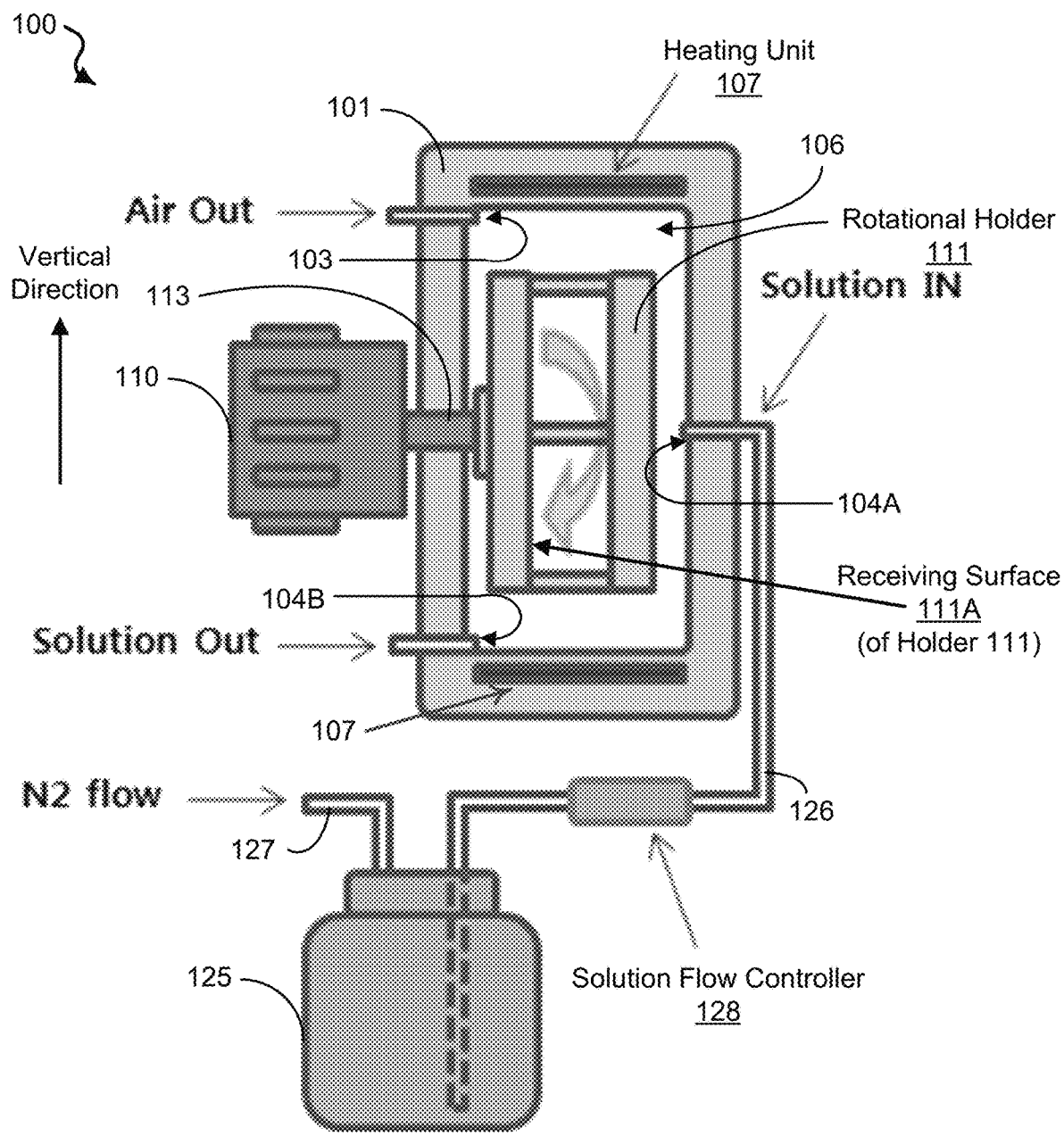
FIG. 1 shows a diagram of an example device to fabricate optoelectronic devices.

Gallium nitride (GaN)-based LEDs may use indium titanium oxide (ITO) transparent contacts as current-spreading layers for uniform current injection. However, the relatively high costs of raw material and manufacturing of ITO layers have generated interest in potentially more cost-effective alternatives. One alternative includes transparent contacts based on zinc oxide (ZnO). ZnO is a wide-bandgap semiconductor having a wurtzite (B4) crystal structure, like GaN, and a direct bandgap of 3.3 eV (at room temperature), also similar to that of GaN. While ZnO offers many favorable properties and is poised to be an ideal candidate to provide an electrical current spreading layer and optically-transparent contact for GaN LED devices, its successful usage for such applications has been limited due to complexities and irreproducibility associated with various techniques for fabricating p-type or n-type ZnO.

The thermal hydro-synthesis (THS) devices, systems, and methods disclosed in this patent document can be used to provide accurate and robust fabrication methods and equipment capable of operability on a large scale to facilitate commercial production of ZnO type GaN-based LEDs.

GaN-based LEDs and other optoelectronic devices (e.g., such as lasers) typically include layers that are epitaxially formed on a crystal substrate (e.g., such as sapphire, SiC, bulk GaN wafers, or (111) Si wafers). These layers include an n-type GaN-containing layer (e.g., GaN:Si), a p-type GaN-containing layer (e.g., GaN:Mg), and a light-emitting active layer or region between the p and n layers. In various implementations, the light-emitting active regions in these structures are generally intrinsic GaN with lower-bandgap $In_xGa_{1-x}N$ quantum wells for increased carrier localization and recombination efficiency. One commonly used technique to grow these structures is metalorganic chemical vapor deposition (MOCVD), which uses precursor gases to form crystalline layers while heating via a heated crystal substrate.

Conventional methods to produce ZnO layers on GaN stacks (e.g., the n-type GaN layer, the p-type GaN layer, and the active region) have included MOCVD, molecular beam epitaxy (MBE), and hydrothermal synthesis techniques, with variable levels of success and significant limitations. For example, some hydrothermal synthesis techniques for growing ZnO layers were demonstrated to be relatively reliable in producing high-quality bulk single-crystals of ZnO, but suffer from low carrier concentrations and low electrical conductivities, which are not suitable for applications as a transparent contact for GaN-based LED or optoelectronic device applications. In growing ZnO layers on a p-type GaN layer, it is desirable that the semiconductor layered substrate is not exposed to conditions that could compromise or damage the sensitive p-type GaN layers. Various implementations of hydrothermal synthesis techniques use hydrogen annealing for increasing the carrier concentration of ZnO that may compromise or damage the sensitive p-type GaN layers.

Figure 4:
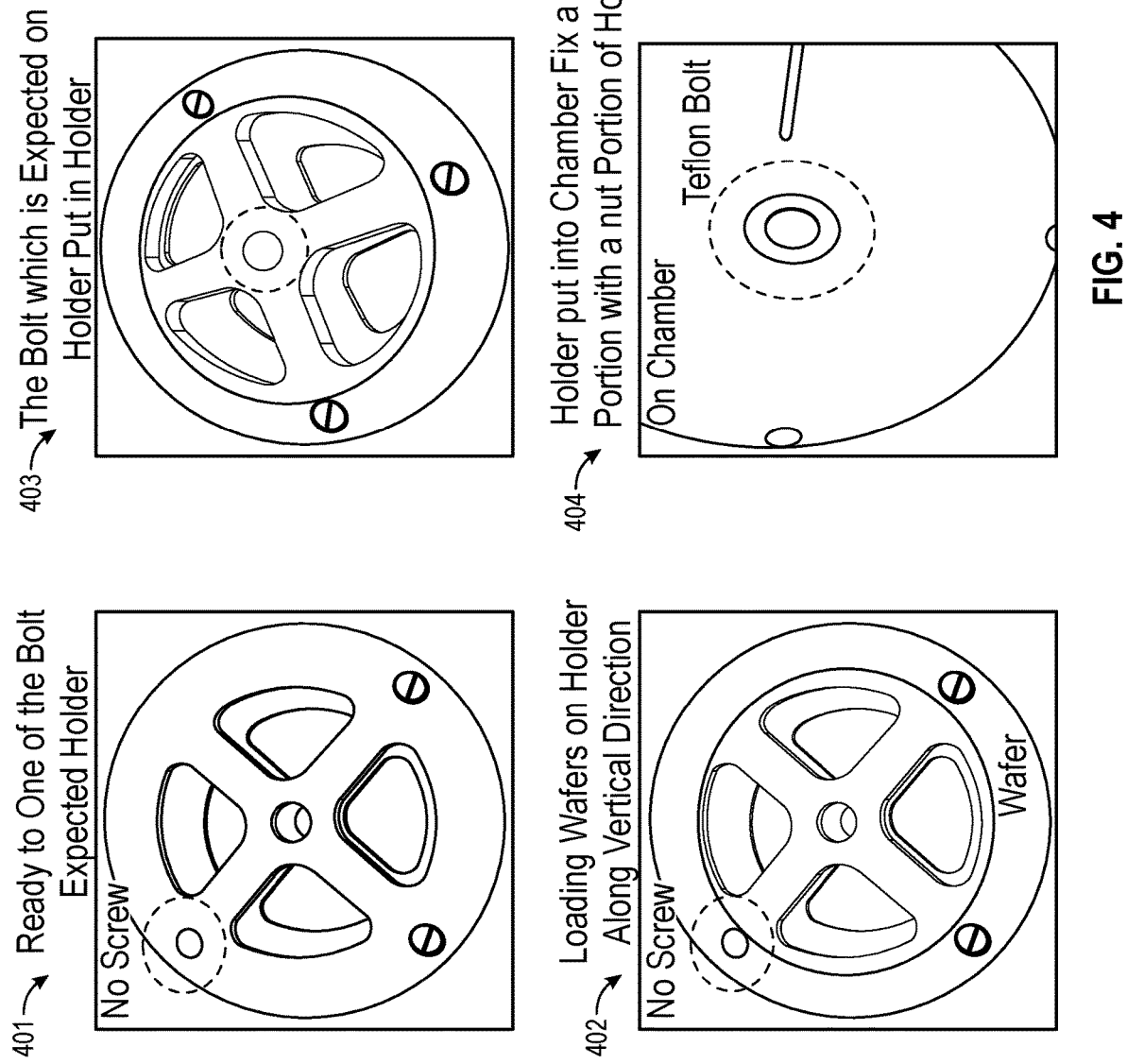
FIG. 4 shows images of an example embodiment of the holder to secure and rotate the substrate during a layer fabrication process of the present technology.
Figure 4:
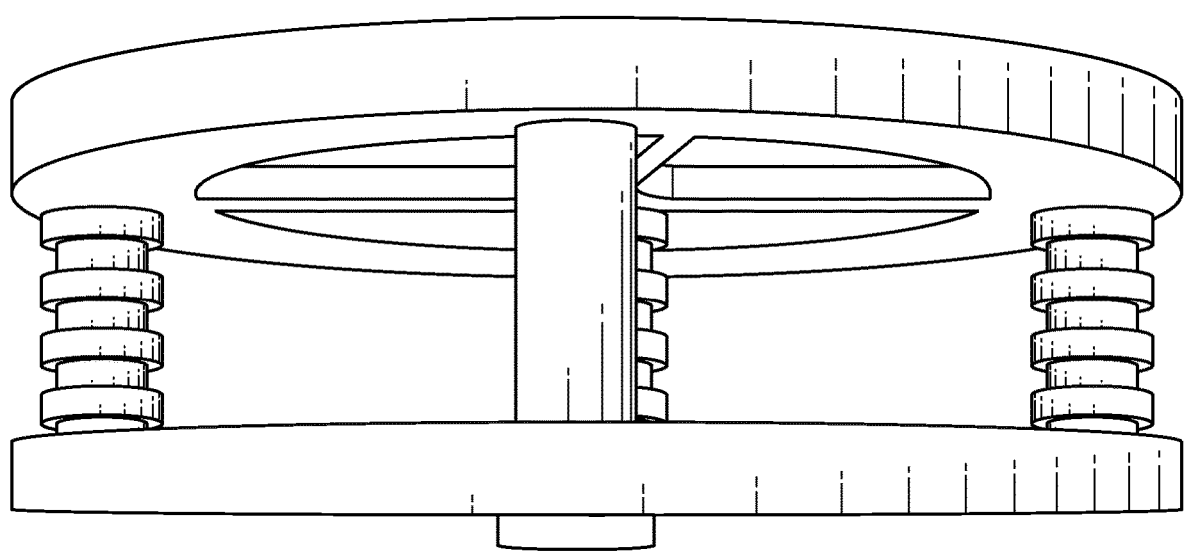
Figure 5:
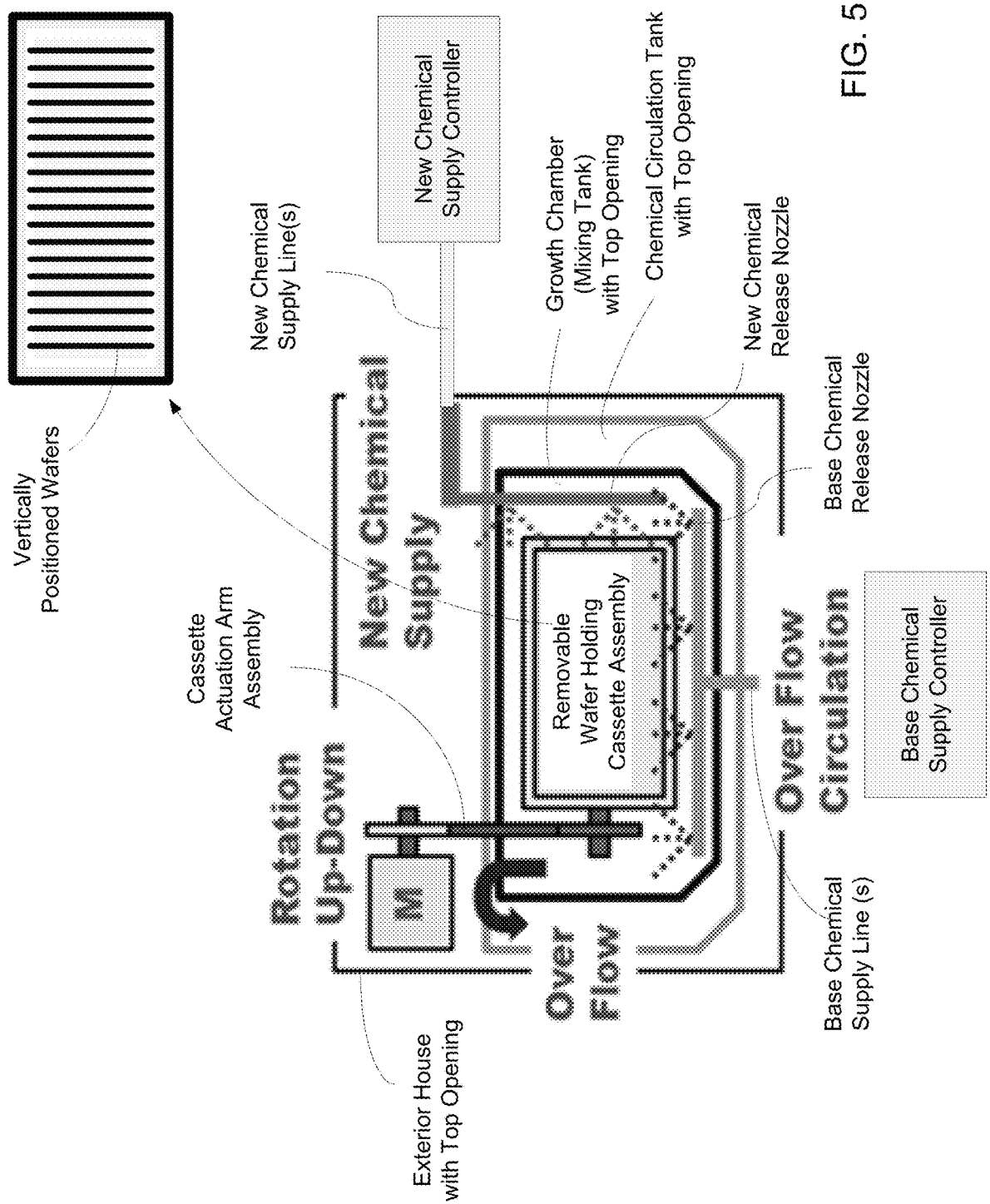
FIG. 5 shows an alternative chamber design for implementing thermal hydro-synthesis (THS) based on an "open bath" design of the chamber while maintain the vertical orientation of the wafers held within the growth chamber for HTS as in the design in FIG. 1.
Figure 6:
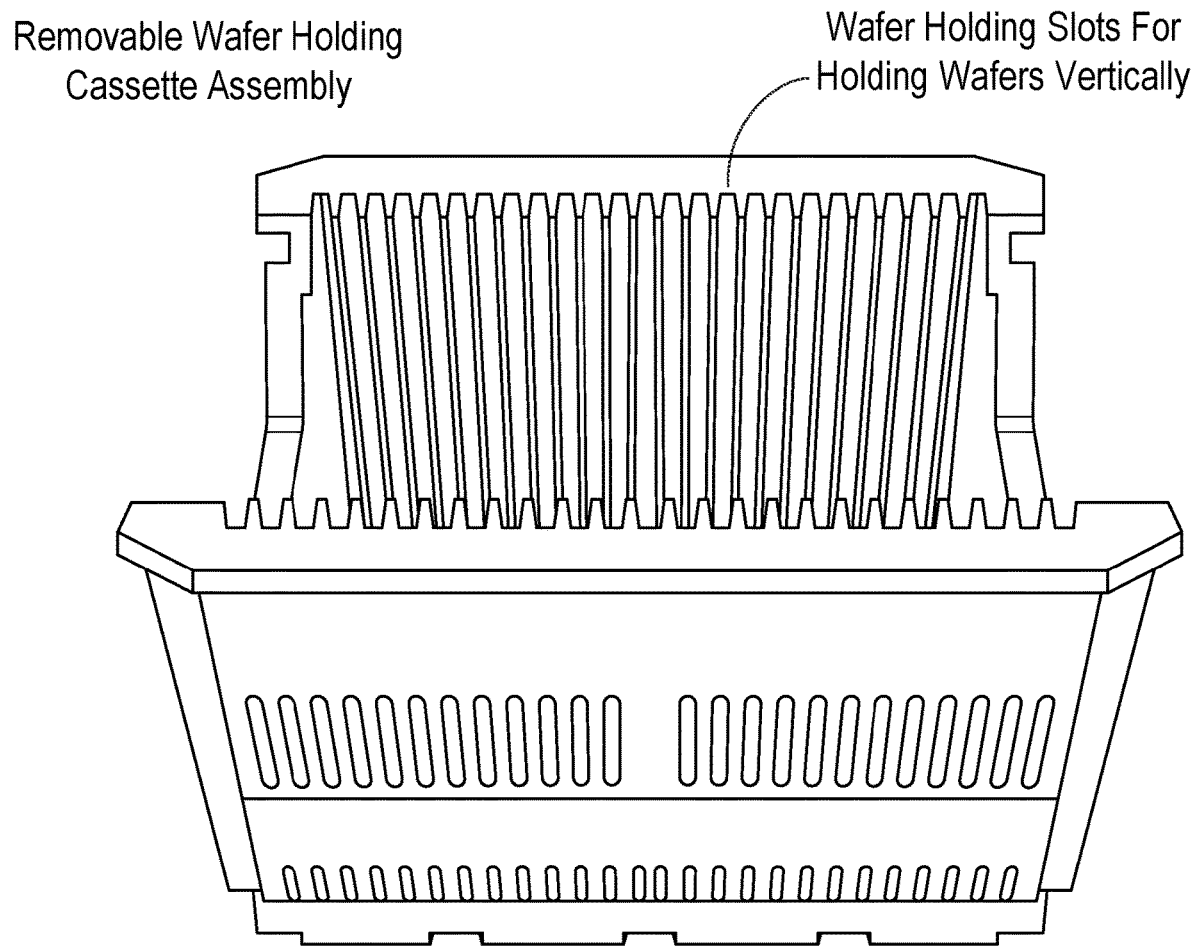
FIG. 6 shows an example of a wafer holding cassette as part of the removable wafer holding cassette assembly of FIG. 1.

The disclosed thermal hydro-synthesis (THS) devices, systems, and methods for forming layers of semiconductor materials to produce optoelectronic devices can be configured for producing a ZnO layer on a GaN layer (e.g., p-type GaN layer) with improved structure properties and device performances. The thermal hydro-synthesis (THS) chambers disclosed in this patent document include two different chamber configurations for holding wafers in the vertical direction for growing ZnO layers. FIGS. 1 and 4 show examples of features of a first chamber configuration and FIGS. 5 and 6 show examples of features of a second chamber configuration.

FIG. 1 shows an illustrative schematic of an example fabrication device 100 of the first chamber configuration to produce optoelectronic devices, e.g., such as forming a ZnO layer on a GaN layer. The device 100 includes a housing 101 to contain or provide support to the components of the device 100. The housing 101 can be configured to have a variety of shapes and sizes, and include various materials to form its structure to provide sufficient strength, support, electrical conductivity and insulation, and insulation and/or dissipation of heat to the device 100. The housing 101 structured to include an interior chamber 106 able to be sealed and contain a liquid medium.

The housing 101 includes access openings (e.g., channel between the interior chamber 106 and the exterior of the housing) located at positions along the interior chamber 106 to allow fluid (e.g., gas, liquid) to enter and exit the interior chamber 106 of the device 100. The housing 101 includes an opening 104A to provide the solution including semiconductor constituents for growing semiconductor layers into the interior chamber 106 of the device 100. For example, as shown in FIG. 1, the opening 104A is positioned about the center of the interior housing 106 with respect to the vertical direction. The housing 101 includes an opening 104B to allow the solution to exit the interior chamber 106. For example, the opening 104B is positioned about the bottom of the interior housing 106. The housing 101 includes an opening 103 to allow gas (e.g., air) to exit the chamber. The device 100 can include valves positioned at a terminus or within the openings 103, 104A, and/or 104B to control the inflow and outflow of the fluid from the interior chamber 106.

The device 100 includes a heating mechanism 107 to generate heat into the interior chamber 106. For example, the housing 100 can include one or more compartments to provide the heating unit 107 proximate to the interior chamber 106. The heating unit 107 is operable to regulate the temperature of the fluid within the interior chamber 106. The heating unit 107 can be positioned at various locations with respect to the interior chamber 106. In the example embodiment shown in FIG. 1, the heating unit 107 is positioned in an upper region and a lower region of the housing 101. For example, the heating unit 107 can include an electrically powered heat device that is electrically coupled to a power source to cause the heating inside the interior chamber. For example, the heating unit 107 may include one or more electrically conductive wires that are wrapped around the chamber 106 inside the housing 101 to generate and direct heat into the interior chamber 106. As illustrated in the example shown in FIG. 1, such a wire can be located in a designated compartment formed in the housing 101. In some implementations, for example, the device 100 includes one or more temperature sensors located at various locations along the interior chamber 106 to measure the temperature of the fluid, in which the measured temperature data can be used in regulating the temperature of the fluid by the heating unit 107. In some implementations of the heating unit 107, the temperature of the fluid can be heated and cooled by induction heating, Peltier effect, electric heating, or other.

The device 100 includes a rotational holder 111 disposed within the interior chamber 106 and oriented such that a receiving surface 111A to receive a sample or substrate upon which to fabricate semiconductor device layers has an orientation in a vertical direction. The device includes a motor 110 coupled to the rotational holder 111 and operable to drive rotational movement of the rotational holder 111 within the interior chamber 102. For example, the motor 110 can be coupled to the rotational holder 111 via a rotational drive shaft 113 extending from the central axis of the rotational holder 111 to the motor 110. For example, the motor 110 drives the rotational holder 111 to spin about its central axis at controlled and regulated speeds. In this orientation, the sample or substrate, e.g., such as a 4" wafer, is aligned such that the top surface of the waver is perpendicular to the vertical axis.

The device 100 includes a solution container 125 to store the solution to be provided into the interior chamber 106 during semiconductor device fabrication operations. The solution container 125 is structured to include an exterior casing with a hollow interior to contain the solution. The container 125 includes an opening, e.g., at the top of the exterior casing, from which fluid conduits (e.g., tubes, pipes, etc.) can pass. For example, the device 100 can include a fluid conduit 126 to transfer the solution from the container 125 to the interior chamber 106 through the opening 104A. In some implementations, for example, the device 100 includes a solution flow controller 128 to control the flow of the solution from the container 125 to the interior chamber 106 through the fluid conduit 126. For example, the device 100 can include a fluid conduit 127 to transfer gas (e.g., $N_2$ gas) into the container 125, e.g., to de-oxygenate the solution or otherwise affect or condition the solution.

The device 100 can include a data processing unit (not shown in FIG. 1) in communication with the motor 110 to control various operation parameters of the motor 110, e.g., including ON/OFF, rotational speed, etc. The data processing unit can also be implemented to control other features of the device 100, e.g., such as regulating the heating unit 107 via measured temperature data from the temperature sensor. The data processing unit includes a processor to process data and a memory in communication with the processor to store data. For example, the processor can include a central processing unit (CPU) or a microcontroller unit (MCU). For example, the memory can include processor-executable code, which when executed by the processor, configures the data processing unit to perform various operations, such as receiving information, commands, and/or data, processing information and data, and transmitting or providing information/data to another entity (e.g. external device). To support various functions of the data processing unit, the memory can store other information and data, such as instructions, software, values, images, and other data processed or referenced by the processor. Various types of Random Access Memory (RAM) devices, Read Only Memory (ROM) devices, Flash Memory devices, and other suitable storage media can be used to implement storage functions of the memory. The memory can store data and information of the data processing unit and other units of the device 100, e.g., including the heating unit 107, the temperature sensor, or other, as well as information about other systems and devices in communication with the device 100. For example, the memory can store device unit parameters, and hardware constraints, as well as software parameters and programs for operation on the device 100. The data processing unit includes an input/output (I/O) unit that can allow communicative connectability of the data processing unit to other units of the device 100. For example, I/O unit can provide the data processing unit to be in communications with other devices or systems, e.g., using various types of wired or wireless interfaces compatible with typical data communication standards, for example, including, but not limited to, Universal Serial Bus (USB), IEEE 1394 (FireWire), Bluetooth, Bluetooth Low Energy (BLE), ZigBee, IEEE 802.11 (Wi-Fi), Wireless Local Area Network (WLAN), Wireless Personal Area Network (WPAN), Wireless Wide Area Network (WWAN), WiMAX, IEEE 802.16 (Worldwide Interoperability for Microwave Access (WiMAX)), 3G/4G/LTE cellular communication methods, and parallel interfaces. The I/O unit 116 can also provide communicative connectability of the data processing unit 106 to an external interface, source of data storage, or display device. The I/O unit of the data processing unit can also interface with other external interfaces, sources of data storage, and/or visual or audio display devices, etc. to retrieve and transfer data and information that can be processed by the processor, stored in the memory, or exhibited on an output unit of the device.

The device 100 is operable to facilitate formation (e.g., growth) of a layer of a semiconductor material on the substrate during spinning of the holder immersed the solution within the interior chamber to produce a semiconductor material device. In some implementations of the device 100 for fabricating ZnO type GaN optoelectronic devices, for example, the holder 111 is loaded with a sample substrate to undergo a THS process. In some examples, the sample substrate can include a 4" wafer, or other size wafer, in which a GaN stack is disposed on an underlying substrate (e.g., sapphire) for the device to be fabricated. Upon loading the holder 111 and closing the housing 101 (e.g., sealing a hatch for loading/unloading of the holder, and operating valves to the openings 104A, 104B, and/or 103), the interior chamber 106 can be filled with the solution to hydrothermally grow ZnO layer on the GaN stack. The motor 111 can be operated, e.g., based on control via the data processing unit, to spin the substrate such that the GaN stack surface is oriented perpendicular to the axis of rotation, e.g., along a vertical direction. The heating mechanism 107 can be operated, e.g., based on control via the data processing unit, to regulate the temperature and heat distribution inside the chamber 106 during the spinning of the substrate on the holder 111 to facilitate controlled deposition and/or growth of the ZnO layer. In some implementations, gas may be provided during the operation via the opening 103.

Figure 2:
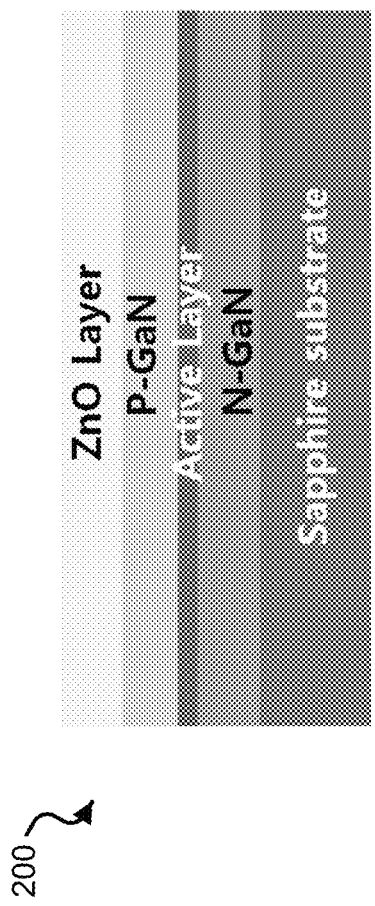
FIG. 2 shows a diagram of an example semiconductor material layered structure fabricated by the example device shown in FIG. 1.

FIG. 2 shows a diagram of an example semiconductor material layered structure 200 fabricated by the example device shown in FIG. 1. The structure 200 of FIG. 2 illustrates an exemplary ZnO based LED device, including a sapphire substrate, n-type GaN layer on the substrate, p-type GaN layer, an active layer between the n-type GaN layer and the p-type GaN layer, and a ZnO layer to provide a current spreading layer and transparent contact for the LED device. For example, the active layer in these structures can include intrinsic GaN with lower-bandgap $In_xGa_{1-x}N$ quantum wells, e.g., for increased carrier localization and recombination efficiency. In some implementations, the device 100 can be used to fabricate the example ZnO based LED device 200 on a substrate having a greater size than those in the conventional LED devices, e.g., such as substrates having a diameter of or greater than 4 inches. In some implementations, the ZnO based LED device 200 is formed on a chip having a chip size greater than 950×500 µm.

In implementations, the device 100 can be operated to perform a method for fabricating an LED device including a ZnO structure. The method includes holding a substrate (e.g., wafer) within the chamber 106 (e.g., using the holder 111) so that a surface of the substrate wafer is along a vertical direction aligned with a gravitational field (gravity), in which the substrate wafer was previously processed to include light-emitting semiconductor layers (e.g., GaN stack) operable to emit light under electrical excitation. The method includes spinning the substrate (e.g., using the holder 111) to spin about a horizontal axis. The method includes, while maintaining the substrate to spin about the horizontal axis, performing a thermal hydro synthesis process in the chamber 106 to grow a single crystal ZnO structure over the light-emitting semiconductor layers to achieve a high quality in the grown single crystal ZnO structure.

In some implementations of the method, for example, the growing of the single crystal ZnO structure formed over the second semiconductor layer includes performing a first thermal hydro synthesis process to grow a bottom single crystal ZnO portion over a top of the light-emitting semiconductor layers; and subsequently performing a second thermal hydro synthesis process to grow a top single crystal ZnO portion extending from the bottom single crystal ZnO portion. In some implementations, for example, the method includes controlling the first thermal hydro synthesis process to ensure that the bottom single crystal ZnO portion is a contiguous structure over the top of the light-emitting semiconductor layers without having voids that expose the top of the light-emitting semiconductor layers. In some implementations, for example, the method includes controlling the second thermal hydro synthesis process to introduce voids into the top single crystal ZnO portion.

Figure 3:
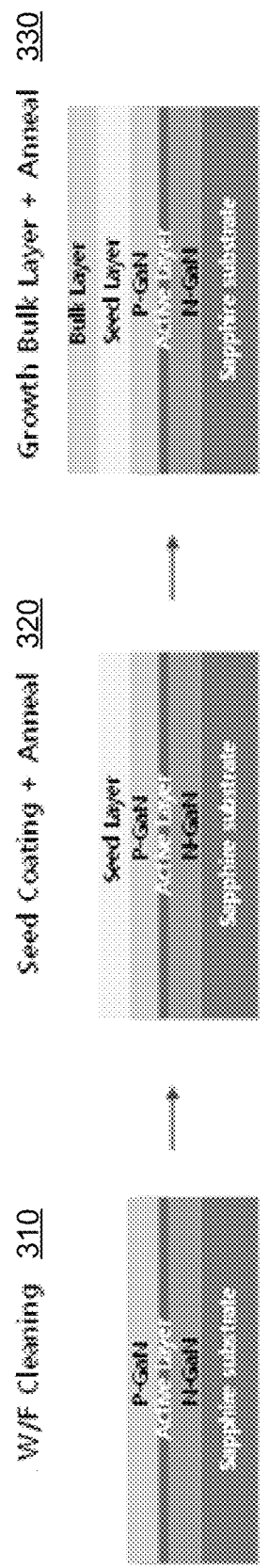
FIG. 3 illustrates an example method of growing a single crystal ZnO structure over a GaN stack using the example device shown in FIG. 1.

FIG. 3 illustrates the method of growing the single crystal ZnO structure over a GaN stack. The method includes a process 310 to clean the substrate (e.g., GaN stack on the sapphire), e.g., which can include pretreating the substrate for a hydrophilic surface. The method includes a process 320 to seed coat ZnO on the GaN layer and anneal the ZnO seeds. For example, the ZnO seeds can be formed by spin coating ZnO (e.g., thickness of 20 nm or less), and annealing the ZnO seeded substrate at 500° C., e.g., on a hotplate or RTA, for 15 min. The method includes a process 330 to form a bulk layer of the ZnO to grow a single crystal ZnO structure over the GaN stack, e.g. using a thermal hydro synthesis process in the chamber 106 of the device 100, such that the ZnO seeded substrate is spun by the holder 111 while immersed in the ZnO solution in the chamber 106. The process 330 includes subsequently annealing the ZnO bulk-layer-formed substrate, e.g., at 250° C., e.g., on a hotplate or RTA, for 15 min. For example, the grown ZnO layer can be formed to have a thickness of 800 nm or less.

FIG. 4 shows images of an example embodiment of the holder 111 for the first chamber configuration in FIG. 1 to secure and rotate the substrate during a layer fabrication process of the present technology. For example, the holder 111 can include multiple receiving surfaces 111A to allow multiple substrates to undergo the fabrication process, and provide the substrate's surface (e.g., GaN stack on sapphire or other substrate) upon which a layer (e.g., ZnO) is grown by using the THS method and the grown ZnO layer is exposed. In the exemplary THS implementations described in FIG. 3, the ZnO growth only occurs on the side of the formed seed layer of each wafer. The images of FIG. 4 show an example implementation of loading a wafer in one of the receiving surfaces of the holder 111, e.g., as shown in images 401, 402, and 403. In the example embodiment, the holder 111 includes a Teflon frame including a plurality of discs or wafers presenting the receiving surface 111A (e.g., structured as an "X" with a central hole through the X), in which the multiple discs or wafers can be connected via securement screws or bolts. The example loading implementation includes image 404 showing securement of the holder 111 having a wafer loaded therein within the interior chamber 106, e.g., coupled to the rotating shaft 113. The image 405 in FIG. 4 further shows a side view of an example of the holder 111 illustrating three wafer holding slots for holding three wafers in the vertical direction in the interior chamber 106 in FIG. 1. More than three wafer holding slots can be included in the holder 111 depending on the needs of the fabrication process.

In the above fabrication equipment design illustrated by the examples in FIGS. 1 and 4 for thermal hydro-synthesis (THS), the interior chamber 106 is enclosed within the housing 101 which is mounted to rotate around the horizontal rotational drive shaft 113. Accordingly, the switching from one batch of wafers in the holder 111 to another batch of new wafers tends to require multiple steps of operations, including draining the chemical solution in the interior chamber 106, opening up the housing 101 to access the holder 111 within the interior chamber 106, replacing the wafers held by the holder 111, closing up the interior chamber 106 and the housing 101, supplying a new chemical solution for the next batch of fabrication and heating up the newly supplied chemical solution to initiate the growth process. In various applications, it is desirable to simplify the above process in connection with the chamber design in FIG. 1 in switching from one batch of wafers to the next batch, to have a more convenient way of reusing and recycling the existing chemical solution in the growth process of the next batch of wafers, and to facilitate fabrication of the next batch of wafers under different chemical conditions.

FIG. 5 shows an alternative chamber design for implementing thermal hydro-synthesis (THS) based on an "open bath" design of the chamber while maintain the vertical orientation of the wafers held within the growth chamber for HTS as in the design in FIG. 1. Under this alternative chamber design, the growth chamber containing a chemical solution includes a mixing tank that can be opened on the top to allow for removing a wafer holder with multiple wafers and placing new batch of wafers in the removable wafer holder without draining the existing chemical solution from the mixing tank. This "open bath" design for the chamber can be used to accommodate for a large number of wafers in each batch and provides a mechanism for adjusting the chemical content of the existing chemical solution used in a prior batch fabrication within the mixing tank to enable fast and diversified fabrication capabilities.

The example design in FIG. 5 includes an exterior housing structured to form a closure and a top opening door to open or close the closure; a chemical circulation tank, located inside the exterior housing, structured to hold a fluid and to include a top opening door to open or close the chemical circulation tank; and a growth chamber or mixing tank, located inside the chemical circulation tank, structured to hold a chemical fluid and to include a top opening door to open or close the growth chamber. The growth chamber includes an overflow path to allow a liquid inside the growth chamber to flow into the chemical circulation tank outside the growth chamber. This overflow can be recycled to go back into the growth chamber during the growth of a layer on the wafers.

The chemicals in the growth chamber are supplied via two or more independent supplies to provide adjustability in the chemical content of the fluid inside the growth chamber for growing a particular structure over each exposed wafer surface and permits the chemical content to be changed during growing a structure over the same wafer or when switching from one batch of wafers to another different batch of wafers.

The example design in FIG. 5 includes an actuator arm located inside the exterior housing to include an extension arm to reach into the growth chamber via the chemical circulation tank. The extension arm is structured to removably engage to a removable wafer holding cassette that includes vertical wafer holding slots for holding wafers inside the growth chamber for growing material layers on the wafers. The extension arm is removable from the extension arm and is removable through the top opening of the growth chamber, the top opening of the chemical circulation tank and the top opening of the exterior housing. A motor ("M") is engaged to the actuator arm and operable to cause motion of the actuator arm so as to move a position of the removable wafer holding cassette inside the growth chamber during growth of material layers on the wafers. Different from the horizontal rotation design in FIG. 1, the design in FIG. 5 no longer rotates the entire growth chamber along a horizontal rotation shaft. As illustrated, the removable wafer holding cassette inside the growth chamber is actuated to move up and down or rock around sideways inside the growth chamber to facilitate the uniform growth of a desired layer over the wafers while the wafers are submerged in the chemical liquid inside the growth chamber.

As illustrated in the example in FIG. 5, two different chemical supply lines are shown for providing desired chemicals into the growth chamber. In this context, the chemical composition of the chemical liquid within the growth chamber is a mixture of chemicals from the two different chemical supply lines so that the growth chamber is a "mixing tank" as a result of the mixing of those chemicals. The first chemical supply line is coupled to the growth chamber on the bottom portion below the removable wafer holding cassette assembly to supply a first chemical liquid into the growth chamber. The second chemical supply line, separated from the first chemical supply line, is coupled to the growth chamber to supply a second chemical liquid into the growth chamber. The second chemical supply line may be located near or adjacent to the first chemical supply line or may be in a different location from the first chemical supply line. In the example in FIG. 5, the second chemical supply line is shown to be a vertical supply line on one side of the removable wafer holding cassette assembly. Other supply line arrangements are possible.

In some implementations, the first chemical supply line can be the main chemical supply line for supply a chemical solution inside the growth chamber so that a batch of wafers held by the removable wafer holding cassette assembly in the chemical solution in order to grow a layer over exposed surfaces of the wafers at an elevated temperature. The first chemical supply line can also be used to recycle an amount of overflow of the chemical solution from the growth chamber to go back into the growth chamber during the growth of the layer on the wafers. The growth of the layer on the wafers involves consumption or reduction of one or more chemical components in the chemical solution supplied from the first chemical supply line. As such, as the layer is being formed over the exposed surfaces of the wafers, the one or more chemical components in the chemical solution are being depleted or reduced in concentration in the chemical solution. This can adversely affect the growth of the layer on the wafers. To address this changing chemical condition of the chemical solution in the growth process, the second chemical supply line may be used to add the one or more chemical components as part of a chemical liquid into the growth chamber to maintain a desired concentration of the one or more chemical components in the chemical solution for growing the layer over the wafers.

Each chemical supply line includes release nozzles along the line to release a chemical into the growth chamber. As shown in the example in FIG. 5, the release nozzles can be spatially distributed along a section of each supply line to provide substantially uniform supply to the different wafers to the extent possible. The motion of the wafers caused at the removable wafer holding cassette assembly by the actuator arm improves the more uniform distribution of the chemicals from each supply line.

In the example in FIG. 5, the first chemical supply line in the bottom of the growth chamber supplies the base chemical liquid into the growth chamber and can also recirculate the overflow from the top of the growth chamber into the circulation tank outside the growth chamber. A base chemical supply controller, shown as a box on the bottom of FIG. 1, is coupled to the first chemical supply line to control this supply and the control can include one or more properties of the base chemical liquid from the first chemical supply line, including, e.g., the chemical composition, the speed/flux, and the temperature of the fluid. One or more heating units may be coupled to the first chemical supply line to control the temperature of the liquid flowing into the growth chamber via the nozzles in the first chemical supply line.

In the example in FIG. 5, the second chemical supply line supplies a new chemical liquid into the growth chamber and is separated or isolated from the overflow from the top of the growth chamber into the circulation tank outside the growth chamber. This new chemical liquid tends to have a different chemical compound from the base chemical liquid from the first chemical supply line. The presence of this new chemical liquid from the second chemical supply line can be used to modify the overall chemical composition of the mixture liquid inside the growth chamber. For example, the second chemical supply line can be used to supply or replenish one or more chemical components that are consumed and thus reduced in concentration in the chemical solution inside the growth chamber due to the growth process on the exposed surface of a wafer. This use of the second chemical supply line for replenishing one or more chemical components that are consumed due to the growth process can be used to maintain a constant or a desired concentration of the one or more replenished chemical components to facilitate the continuous growth of a layer on the wafer (such as a ZnO layer) because the one or more chemical component of making ZnO that is supplied in the base chemical liquid from the first chemical supply line is being used and consumed to cause the fluid in growth chamber to become deficient in such one or more chemical components for making ZnO. This replenishing mechanism by using the second chemical supply line can be used to provide a real-time adjustment to the chemical conditioning in the chemical solution during the growth cycle in the growth chamber to facilitate the growth of ZnO layers or other semiconductor structures on the wafers. For another example, the second chemical supply line can be used for adding one or more additional chemical components into the chemical solution in the growth chamber that are not supplied from the first chemical supply line either for growing one or more layers over the same batch of wafers in the removable wafer holding cassette assembly or for growing layers over a different batch of wafers in a subsequent fabrication process. Therefore, the growth chamber can function as a mixing tank of the base chemical liquid from the first chemical supply line and the new chemical liquid from the second chemical supply line. More than two different chemical supply lines can be provided in certain implementations to provide additional mixing flexibility and individual control of different chemical liquids for the growth chamber. A new chemical supply controller, shown as a box on the right hand side of the removable wafer holding cassette assembly of FIG. 1, is coupled to the second chemical supply line to control the supply of the new chemical liquid and the control can include one or more properties of the new chemical liquid from the second chemical supply line, including, e.g., the chemical composition, the speed/flux, and the temperature of the fluid. One or more heating units may be coupled to the second chemical supply line to control the temperature of the liquid flowing into the growth chamber via the nozzles in the second chemical supply line. Therefore, the liquids in the first and second chemical supply lines are pre-heated before their entry into the growth chamber. This pre-heating design can be used to provide better and faster control of the final desired temperature of the chemical solution in the growth chamber for growing a layer on the wafers.

Although not explicitly shown in FIG. 5, in some implementations, one or more heating units may be coupled to the growth chamber to provide the desired heating control for the temperature inside the growth chamber.

In implementations, one or more heating units may be coupled to the growth chamber, the first chemical supply line, or the second chemical supply line, to apply heat and to provide a controlled heated condition of the chemical liquid inside the growth chamber to facilitate a growth process on the wafers. In certain implementations, one or more heating unit coupled to the growth chamber can be additional or supplemental to one or more existing heating units in the first chemical supply line or/and the second chemical supply line for heating up and maintain a desired heated condition in the chemical liquid in the growth chamber.

FIG. 6 shows an example of a wafer holding cassette as part of the removable wafer holding cassette assembly of FIG. 1. This wafer holding cassette includes vertical slots, e.g., 20 to 30 slots or more, for holding wafers along the vertical direction and has a top opening to allow for ease of placing wafers in the vertical slots. This wafer holding cassette can be engaged to the removable wafer holding cassette assembly of FIG. 1 which is further engaged to the actuator arm.

The chamber design in FIG. 5 can be operated by using the removable wafer holding cassette assembly that holds a new batch of wafers to place the wafers into the growth chamber. This process can be done manually by an operator person or automatically by a robotic arm. Once the wafers are in position within the growth chamber, the first and second chemical supply lines can be operated to provide the desired chemical solution within the growth chamber with the desired chemical composition and at a desired temperature. The actuator arm is operated to move the removable wafer holding cassette assembly with wafers during the growth operation. For growing a ZnO layer over the substrate, for example, the temperature of the growth chamber may be set around 70 degrees Celsius. Upon completion of the growth of a desired layer over the wafers, additional operations may be performed. For example, an additional layer (e.g., ZnO) may be further grown over the first ZnO layer. This process may be achieved by maintaining the same wafers within the growth chamber while adjusting a condition in the chemical solution of the growth chamber, e.g., a chemical composition adjustment by using the second chemical supply line, or a temperature of the chemical solution. Under such a different condition, the second ZnO layer may have a desired different property from the first ZnO layer. Such a ZnO structure with two different ZnO layers of different properties may be desirable in various LED devices, e.g., ZnO layers with different levels of voids. For another example, upon completion of the growth of a desired layer over the wafers, the wafers may be removed from the growth chamber and be replaced by a new batch of wafers, where the removable wafer holding cassette assembly holding the first batch of wafers is disengaged and removed from the chamber, and, without draining the chemical solution used for growing a desired layer over the first batch of wafers, inserting another removable wafer holding cassette assembly holding the second batch of new wafers into the growth chamber under the same growth condition or a different growth condition.

In comparison with the chamber design in FIG. 1, the "open bath" chamber design in FIG. 5 can be made to hold a larger number of wafers in a larger growth chamber to complete forming a desired layer over each wafer over a shorter amount of time.

Figure 7A:
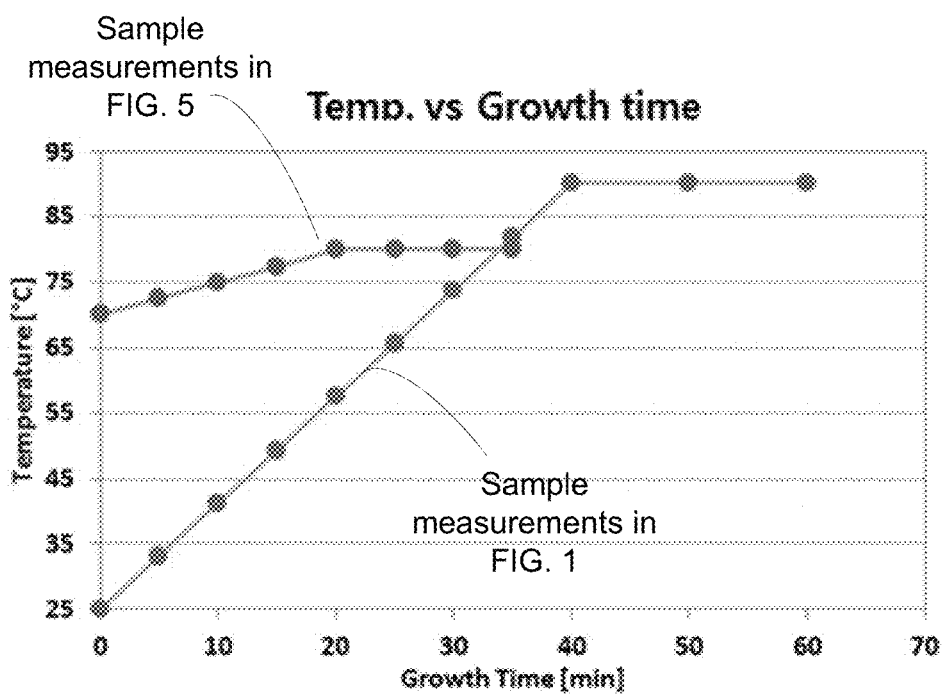
FIGS. 7A and 7B show examples of measurements for comparing a growth chamber having a capacitor of one liter for holding three wafers based on the design in FIG. 1 and a growth chamber having a capacitor of fifteen liters for holding twenty-five wafers based on the design in FIG. 5.
Figure 7B:
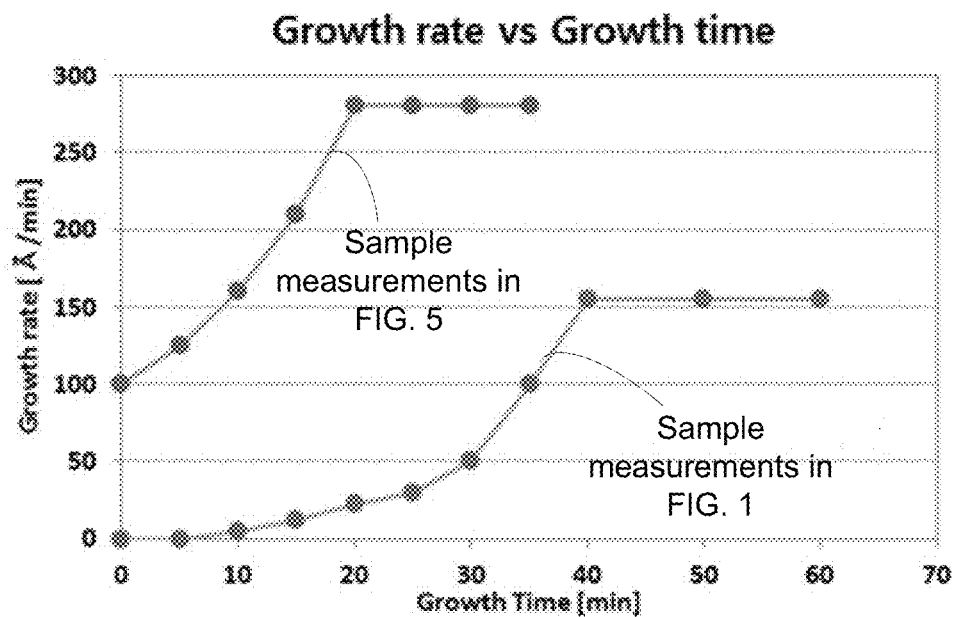

FIGS. 7A and 7B show examples of measurements for comparing growth performance in depositing a ZnO layer in a growth chamber having a capacitor of one liter for holding three wafers based on the design in FIG. 1 and a growth chamber having a capacitor of fifteen liters for holding twenty-five wafers based on the design in FIG. 5. FIG. 7A shows the temperature of the chemical solution as a function of the time. The chamber design in FIG. 1 relies on one or more heating units in the chamber to heat up the chemical solution and this heating process takes time. In contrast, the chamber design in FIG. 5 pre-heats the chemical solution to supply the heated chemical solution at the desired growth temperature and thus avoids the longer time in heating up the chemical solution inside the growth chamber in the design in FIG. 1 in the first chemical supply line and thus provides a shortened time for reaching a desired starting elevated temperature of the chemical solution within the chamber. FIG. 7B further shows that the growth rate in the chamber in FIG. 5 is higher than the growth rate in the chamber in FIG. 1. The growth chamber based on the design in FIG. 5 has better growth performance in part due to the unique features built in to the design including the chemical replenishing capability provided by the second chemical supply line to re-gain the diminishing concentration of one or more chemical components that are in the chemical solution from the first chemical supply line but are consumed in growing a ZnO layer over the wafers. Accordingly, the design in FIG. 5 can provide better chemical conditioning for the fabrication on multiple wafers at the same time by using the replenishing mechanism via the second chemical supply line and the pre-heating operation.

Figure 8:
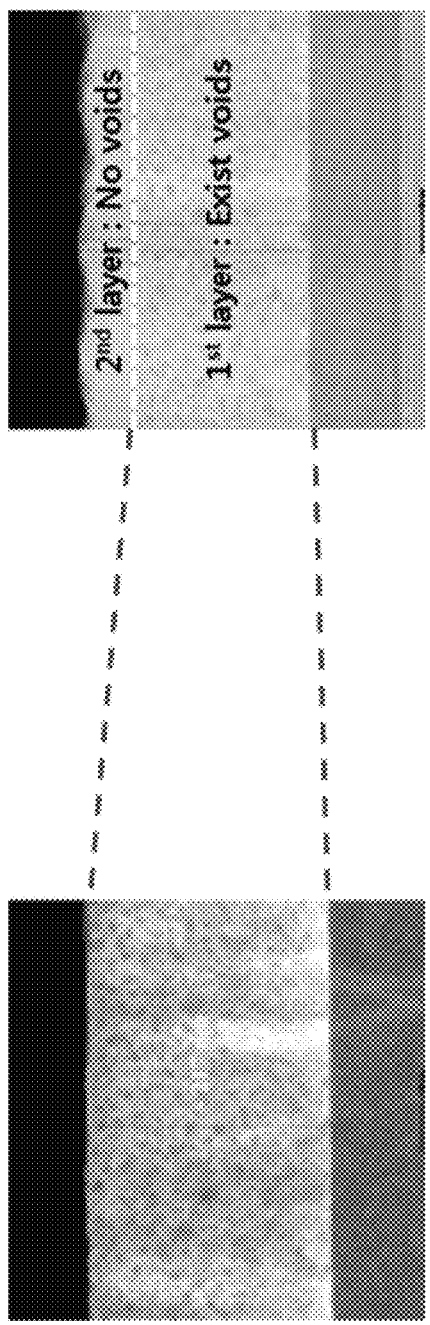
FIG. 8 shows an example of growing two different ZnO layers over a batch of wafers in two different and sequential growth cycles or "baths" where the second chemical supply line was used to supply a chemical solution that alters the mixture salutation formed by the base chemical solution from the first chemical supply line and a new chemical solution from the second chemical supply line.
Figure 8:
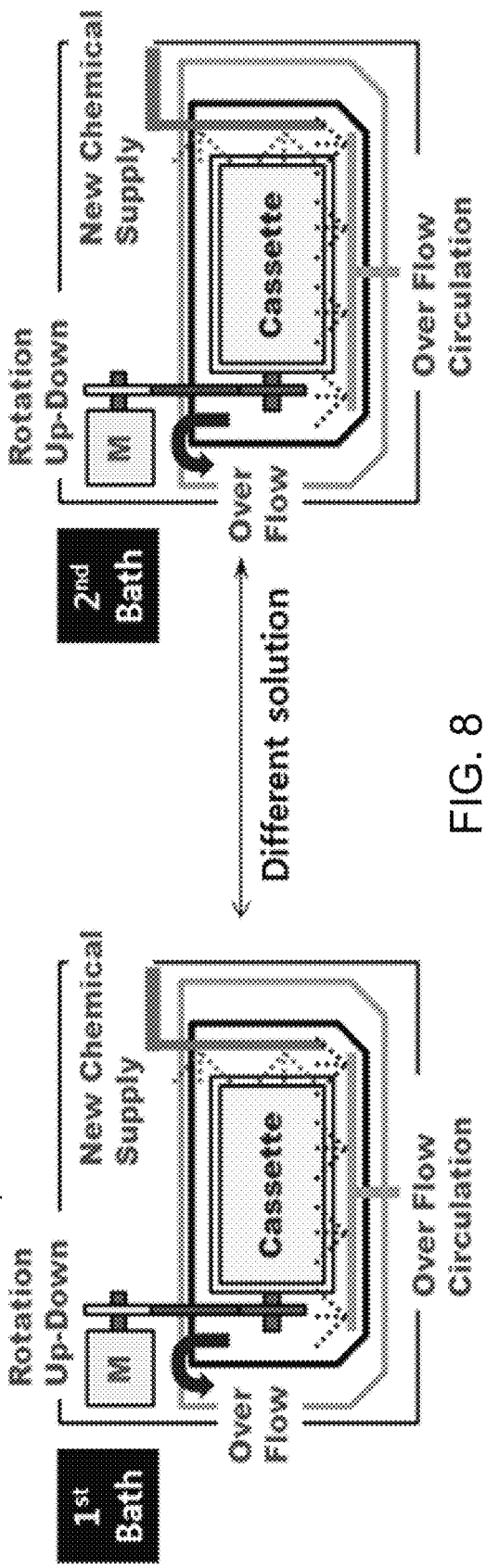

FIG. 8 shows an example of growing two different ZnO layers over a batch of wafers in two different and sequential growth cycles or "baths" where the second chemical supply line was used to supply a chemical solution that alters the mixture salutation formed by the base chemical solution from the first chemical supply line and a new chemical solution from the second chemical supply line. After growing the first ZnO layer over the wafers under a first condition or "first bath," the second chemical supply line was used to change the total chemical composition in the mixture of the chemical solutions as a "second bath" to grow a second ZnO layer over the first ZnO layer. The conditions of the "first bath" and the "second bath" were controlled such that the first ZnO layer has more voids than the second ZnO layer which has significantly less voids. Such a two-layer ZnO structure can exhibit different optical diffusion properties that are desirable in certain LED devices for improved output optical efficiency.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed are techniques and structures as described and shown, including:

1. A device for fabricating a semiconductor material device, comprising:
    an exterior housing structured to form a closure and a first top opening door to open or close the closure;
    a chemical circulation tank, located inside the exterior housing, structured to hold a fluid and to include a second top opening door to open or close the chemical circulation tank;
    a growth chamber, located inside the chemical circulation tank, structured to hold a fluid and to include a third top opening door to open or close the growth chamber, the growth chamber including an overflow path to allow a liquid inside the growth chamber to flow into the chemical circulation tank;
    a first chemical supply line coupled to the growth chamber proximate to a bottom of the growth chamber and having a portion extending into the growth chamber to supply a first chemical liquid into the growth chamber;
    a second chemical supply line, separated from the first chemical supply line, coupled to the growth chamber and having a portion extending into the growth chamber to supply a second chemical liquid into the growth chamber;
    one or more heating units coupled to the growth chamber, the first chemical supply line or the second chemical supply line, to apply heat provide a controlled heated condition of a chemical liquid inside the growth chamber;
    an actuator arm located inside the exterior housing to include an extension arm to reach into the growth chamber via the chemical circulation tank, wherein the extension arm is structured to removably engage to a removable wafer holding cassette that includes vertical wafer holding slots for holding wafers inside the growth chamber for growing material layers on the wafers and is removable from the extension arm through the top opening of the growth chamber, the top opening of the chemical circulation tank and the top opening of the exterior housing; and
    a motor engaged to the actuator arm and operable to cause motion of the actuator arm so as to move a position of the removable wafer holding cassette inside the growth chamber during growth of material layers on the wafers,
    wherein the second top door is disposed inside the exterior housing, and the third top door is disposed inside the chemical circulation tank, and wherein the portion of the first chemical supply line has a continuous part of the first chemical supply line located inside the growth chamber, the continuous part of the first chemical supply line having nozzles positioned along a length of the continuous part of the first chemical supply line for delivering the first chemical liquid at different locations inside the growth chamber, wherein the portion of the second chemical supply line has a continuous part of the second chemical supply line located inside the growth chamber, the continuous part of the second chemical supply line having nozzles positioned along a length of the continuous part of the second chemical supply line for delivering the second chemical liquid at different locations inside the growth chamber, and wherein the continuous part of the second chemical supply line extends inside the growth chamber in a direction from a top of the growth chamber to the bottom of the growth chamber.

2. The device of claim 1, further comprising:

a data processing unit including a processor to process data and a memory to store or buffer data, wherein the data processing unit is in communication with the motor to control operation of the motor and the heating unit to regulate heating of the growth chamber.

3. The device as in claim 1, wherein the second chemical supply line coupled to the growth chamber includes a portion inside the growth chamber and the portion includes different nozzles for delivering the second chemical liquid at different locations inside the growth chamber.

* * * * *